United States Patent [19]
Kimura et al.

[11] Patent Number: 6,015,066
[45] Date of Patent: Jan. 18, 2000

[54] LIQUID SUPPLYING DEVICE

[75] Inventors: Yoshio Kimura; Satoshi Morita; Yuji Matsuyama; Norio Semba, all of Kumamoto-ken, Japan

[73] Assignee: Tokyo Electron Limited, Tokyo, Japan

[21] Appl. No.: 08/991,783

[22] Filed: Dec. 16, 1997

[30] Foreign Application Priority Data

Dec. 24, 1996 [JP] Japan ................................ 8-355723
Dec. 25, 1996 [JP] Japan ................................ 8-356119

[51] Int. Cl.[7] .................................................. B67D 5/08
[52] U.S. Cl. ............................ 222/64; 222/61; 137/208
[58] Field of Search .......................... 222/152, 64, 478, 222/61; 137/205, 208, 209

[56] References Cited

U.S. PATENT DOCUMENTS 5,383,574  1/1995  Raphael ............................ 222/64
5,416,047  5/1995  Konishi et al. .
5,868,278  2/1999  Chen ................................ 222/152

OTHER PUBLICATIONS

Patent Abstracts of Japan, vol. 18, No. 81, Feb. 9, 1994, JP 5–289344, Nov. 5, 1993 (abstract only).
Patent Abstracts of Japan, vol. 16, No. 524, Oct. 28, 1992, JP 4–197434, Jul. 17, 1992 (abstract only).

*Primary Examiner*—Steven O. Douglas
*Attorney, Agent, or Firm*—Oblon, Spivak, McClelland, Maier & Neustadt, P.C.

[57] ABSTRACT

Disclosed herein is a device for supplying a liquid to a plurality of apparatuses which apply the liquid to substrates to process the substrates. The device comprises a tank containing the liquid, a supply passage for supplying the liquid from the tank to the apparatuses, branch passages connected to the supply passage, for supplying the liquid to liquid-applying members provided in the apparatuses, and valves provided on the branch passages, respectively. The valves are controlled each other, for opening and closing the branch passages such that the liquid-applying member of one apparatus applies the liquid to a substrate while the liquid-applying member of any other apparatus remains to apply the liquid to a substrate.

15 Claims, 11 Drawing Sheets

LIQUID SUPPLYING DEVICE

BACKGROUND OF THE INVENTION

The present invention relates to a device for supplying a liquid to apparatuses which apply the liquid to substrates, thereby to process the substrates.

In the manufacture of a semiconductor device, a so-called "developing process" is performed. Generally, the developing process comprises the following steps. First, a substrate, e.g., a semiconductor wafer (hereinafter referred to as "wafer"), is mounted on a rotating table known as "spin chuck." (The wafer is coated with a resist film which has been exposed to light through a patterned mask.) Then, the spin chuck is rotated, thus spinning the wafer. A developing liquid is applied onto the spinning wafer from a liquid-applying member, such as a nozzle, located above the center of the wafer. The liquid spreads due to the centrifugal force acting on the wafer and is uniformly coated on the surface of the wafer. Thus, the resist film is developed.

The developing process is performed by a developer. The developing apparatus comprises a nozzle and a liquid supplying device. The liquid supplying device supplies a developing liquid to the nozzle. The liquid supplying device comprises a main tank, an intermediate tank, a flow rate adjuster, a filter, a temperature controller, and a valve. The main tank contains an amount of the developing liquid. The intermediate tank stores the developing liquid supplied from the main tank. The flow rate adjuster adjusts the rate at which the liquid is supplied to the nozzle. The filter removes impurities from the developing liquid. The temperature controller adjusts the temperature of the liquid at a desired value. The valve is provided to supply the developing liquid to the nozzle and stop supplying the same thereto.

The main tank, intermediate tank, flow rate adjuster, filter, temperature controller, and valve are connected in series in the order mentioned, by liquid passages (e.g., pipes). When the valve is opened, the developing liquid can be supplied to the nozzle. If a plurality of developers are installed, the same number of liquid supplying devices are used and operated independently, each connected to one developer. In each liquid supplying device, a specific gas is introduced into the intermediate tank, which is pressurized to a predetermined extent. The developing liquid is thereby supplied from the intermediate tank via the valve to the nozzle. Finally, the liquid is applied from the nozzle to the wafer.

When the surface of the developing liquid in the intermediate tank lowers to a lower-limit level, the supply of the gas into the intermediate tank is stopped. At the same time, the intermediate tank is depressurized through an evacuation pipe connected to the top of the tank and opening to the interior thereof. The developing liquid is thereby supplied into the intermediate tank from the main tank until the surface of the liquid in the intermediate tank rises to the upper-limit level. Even after the liquid is thus replenished, the depressurizing is continued for a predetermined time before the developer performs the developing process. The developing liquid in the intermediate tank is thereby degassed, expelling gases, such as $O_2$ and $N_2$, from the liquid.

A system comprising a plurality of developers, each having a liquid supplying device, is massive, and its manufacturing cost is high. The more developers the system has, the larger the system is, and the higher the manufacturing cost thereof is.

Further, the use efficiency of each light supplying device is low. This is because the apparatus supplies the liquid to the associated developer for a time much shorter than the time for which the developer performs the developing process on a wafer.

Still further, the efficiency of depressurizing the intermediate tank to degass the developing liquid contained therein is limited in the conventional. The depressurizing efficiency is proportional to the sectional area of the intermediate tank. Hence, the greater the diameter of the intermediate tank, the better. If the diameter of the tank is increased, however, the liquid supplying device will become proportionally large, and it will be difficult to supply the developing liquid stably and smoothly.

BRIEF SUMMARY OF THE INVENTION

The first object of the present invention is to provide a novel, improved processing-liquid supplying device which can supply a processing liquid to a plurality of processing apparatuses.

The second object of the invention is to provide a novel, improved processing-liquid supplying device in which a degassing member is immersed in the processing liquid, thereby degassing the liquid at a high efficiency.

To achieve the objects described above, a liquid supplying device according to a first aspect of the invention is designed to supply a liquid to a plurality of apparatuses which apply the liquid to substrates to process the substrates. The device comprises: at least one tank for containing the liquid; a supply passage for supplying the liquid from the tank to the apparatuses; branch passages connected to the supply passage, for supplying the liquid to liquid-applying members provided in the apparatuses; and valves provided on the branch passages, respectively, and controlled to open and close the branch passages such that the liquid is supplied to said apparatuses at different times.

If two apparatuses are provided and two valves are used, the valves are controlled in the following manner. The first valve, for example, is opened by a signal representing that the application of the liquid has completed in the second apparatus, and the liquid is thereby supplied to the first apparatus through the first valve. Alternatively, before the liquid is applied in the one apparatus it may be determined whether or not the liquid is applied to a substrate in the other apparatus.

Since one liquid supplying device is used to supply the developing liquid to a plurality of liquid-applying apparatuses, the system incorporating the liquid supplying device is smaller than otherwise. The system can be manufactured at a lower cost, can be more easily maintained, and can be operated with a higher efficiency than in the case where two devices are used to supply the developing liquid to the two apparatuses, respectively.

In the device according to the first aspect of the invention, an upper-limit level and a lower-limit level are set for the tank such that the liquid is replenished to a level between the upper- and lower-limit levels while the liquid-applying members of the apparatuses remain to apply the liquid to substrates. In this case, the liquid can be supplied into the tank while none of the apparatuses is applying the liquid to a substrate. Hence, the liquid can be replenished in the tank, without interrupting the application of the liquid to a substrate. This helps to increase the throughput of each liquid-applying apparatus.

The lower-limit level is so set that the liquid remains in the tank in an amount large enough for the substrates of at least one lot when the surface of the liquid lowers to the lower-limit level L. Therefore, the process on the substrates of the same lot is not interrupted even if the liquid cannot be replenished in the tank for some reason or other.

A liquid supplying device according to a second aspect of the invention is designed to supply a liquid to a plurality of apparatuses which apply the liquid to substrates to process the substrates. This device comprises: a plurality of tanks for containing the liquid; a supply passage for supplying the liquid from the tank to the apparatuses; a switching device for achieving switching from one of the tanks to any other one of the tanks; branch passages connected to the supply passage, for supplying the liquid to liquid-applying members provided in the apparatuses; and valves provided on the branch passages, respectively, and controlled of each other, for opening and closing the branch passages such that the liquid-applying member of one apparatus applies the liquid to a substrate while the liquid-applying member of any other apparatus remains to apply the liquid to a substrate.

Switching is achieved from one tank to any other tank, while none of the apparatuses is applying the liquid to a substrate. Namely, switching from one tank to another can be accomplished, without interrupting the developing process. If two apparatuses are provided, the liquid is replenished in the first tank while the liquid is being supplied from the second tank to the apparatuses. Thereafter, the liquid can be supplied from the first tank to the apparatuses immediately after the switching from the second tank to the first tank is made. The valves are controlled in the same way as in the liquid-supplying device according to the first aspect of the invention.

A liquid supplying device according to a third aspect of the invention is designed to supply a liquid to an apparatus which applies the liquid to a substrate to process the substrate. The device comprises: a plurality of tanks for containing the liquid; evacuation means provided outside the tanks; a plurality of degassing members provided in the tanks, respectively, for degassing the liquid contained in the tanks while immersed in the liquid; and an evacuation passage connecting the space to the evacuation means. Each of the degassing members comprises a body and a space-maintaining member inserted in the body. The body is made of a material which passes gas but does not pass liquid. The space-maintaining member provides and maintains a space in the body.

Since the degassing members are immersed in the liquid contained in the tanks, each has a large degassing area, i.e., a large surface contacting the liquid. The liquid can be therefore degassed very efficiently. The body of each degassing member is made of, for example, polytetrafluoroethylene (PTFE), polyfluoroalcoxy (PFA) or fluorinated ethylene propylene (FEP) and has a space in it. The body can degass the liquid, at its entire surface and, hence, with high efficiency.

The space-maintaining member inserted in the body is either a spiral wire and a spacer made of synthetic resin. The space-maintaining member prevents the body from collapsing when the degassing member is depressurized by a vacuum suction unit. Each degassing member can degass the liquid with high efficiency.

Each of the degassing members may be a flexible tube. The degassing members can be easily bent in any shape desired to be arranged in the tanks and to have a large degassing area.

The degassing members may be bent in the form of a spiral. If the degassing members are so bent, each provides a space. In this space a level sensor such as a float sensor can be easily arranged in the tank.

A liquid supplying device according to a fifth aspect of the invention is desired to supply a liquid to an apparatus which applies the liquid to a substrate to process the substrate. This device comprises: a plurality of tanks for containing the liquid; evacuation means provided outside the tanks; a plurality of degassing members provided in the tanks, respectively, for degassing the liquid contained in the tanks while immersed in the liquid; and an evacuation passage connecting the space to the evacuation means. Each of the degassing members comprise each a sheet-shaped body made of a gas-liquid separating material, a space-maintaining member inserted in the body and providing and maintaining a space in the body, and a interval-maintaining member.

The sheet-shaped body is wound, forming turns spaced an intervals by the interval-maintaining member. Therefore, each degassing member has a very large degassing area and provides a space. A level sensor such as a float sensor can be easily arranged in the tank.

The space-maintaining member may be a wire mesh. The space-maintaining member prevents the body from collapsing when the degassing member is depressurized by a vacuum suction unit. Each degassing member can degass the liquid with high efficiency. Further, the sheet-shaped body may be bent in zig-zag fashion. In this case, too, the body can have a large degassing area. The sheet-shaped body may be made of, for example, PTFE, PFA or FEP as in the third embodiment.

A liquid supplying device according to a fifth aspect of this invention is designed to supply a liquid to an apparatus which applies the liquid to a substrate to process the substrate. The device comprises: a plurality of tanks for containing the liquid; evacuation means provided outside the tanks; a plurality of degassing members provided in each of the tanks and positioned such that tops of the degassing members are at different levels, for degassing the liquid contained in the tank while immersed in the liquid; and an evacuation passage connecting the spaces of the degassing members to the evacuation means. Each of the degassing members comprises a body and a space-maintaining member inserted in the body. The body is made of a material which passes gas but does not pass liquid. The space-maintaining member provides and maintains a space in the body.

Since the degassing members provided in each tank are positioned such that their tops are at different levels, they serve to degass the liquid in the tank with high efficiency, no matter how the surface level of the liquid changes in the tank. More precisely, the degassing members can efficiently degass the liquid when the surface of the liquid rises to a prescribed upper-limit level and also when the surface of the liquid falls to a prescribed lower-limit level.

As long as the tops of the degassing members provided in each tank are at different levels, the lower part of one degassing member may be located below the upper part of any other degassing member. In addition, each degassing member may be a flexible tube or a flexible sheet, wound in the form of a spiral, as in the liquid-supplying devices according to the third to fourth aspects of the invention.

The device according to the fifth aspect of the invention may further comprise a plurality of level sensors provided in the tanks, respectively, for detecting surfaces of the liquid contained in the tanks, and a controller for opening and closing the evacuation passage. If this is the case, it is determined from the detected surface of the liquid whether each degassing member is completely immersed in the liquid, and only the degassing member or members which are found to be completely immersed in the liquid are depressurized to degass the liquid. Thus, the liquid can be automatically degassed with high efficiency.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1:
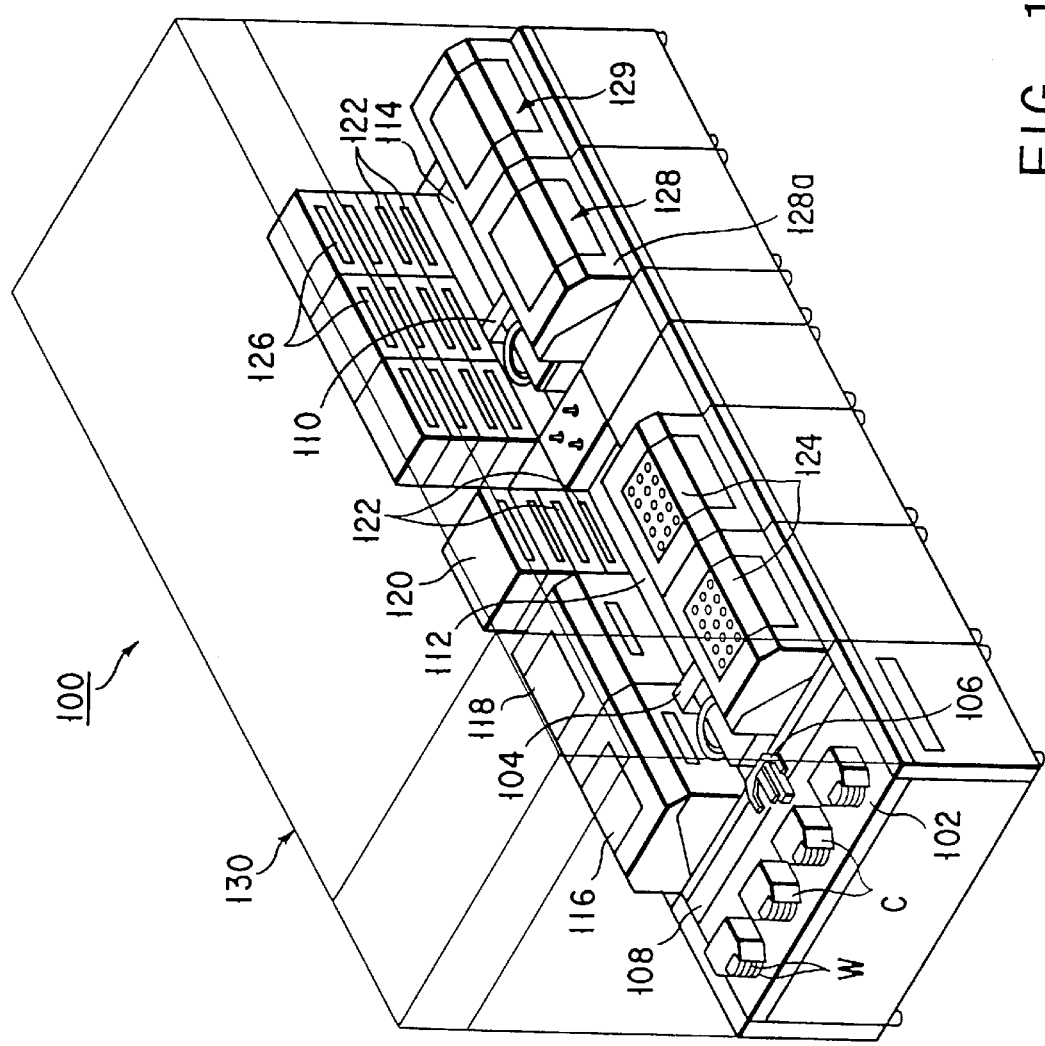
FIG. 1 is a perspective view of a resist-coating and -developing system which incorporates two identical developers and one liquid supplying device provided for the developers, said device being the first embodiment of the invention.

Liquid supplying devices according to the present invention, which are designed to supply a developing liquid to developers, will be described with reference to the accompanying drawings. The components of any liquid supplying device which are identical or similar in function and structure to those of any other device are designated at the same reference numerals and will not be described in details.

FIG. 1 shows a resist-coating and -developing system 100. The system 100 is designed to wash semi-conductor wafers, adhere resists to the wafers, heat the semiconductor wafers, cool the wafers to a prescribed temperature, expose the wafers to light, develop the resists on the wafers, and heat the wafers after developing the resists.

As shown in FIG. 1, the system 100 comprises a cassette station 102, a first transport arm 104, a transport mechanism 106, a transport path 108, a second transport arm 110, a first arm track 112, and a second arm track 114. Cassettes C, each containing a plurality of wafers W, are aligned on the cassette station 102, along the transport path 108. The transport mechanism 106 can moved along the transport path 108. It is designed to remove the wafers W from the cassettes C and transport them to the first transport arm 104. The transport arms 104 and 110 can move along the arm tracks 112 and 114, respectively.

The resist-coating and -developing system 100 further comprises various wafer-processing apparatuses. The apparatuses are a brush washing apparatus 116, a water-washing apparatus 118, an adhesion apparatus 120, a cooling apparatus 122, two resist-coating apparatuses 124, a heating apparatus 126, and two developers 128 and 129.

The brush washing apparatus 116 rotates and washes wafers W removed from the cassettes C. The water-washing apparatus 118 applies water in the form of a high-pressure jet, to the surfaces of the wafers W, thereby washing the wafers W. The adhesion apparatus 120 renders each wafer W hydrophobic at a surface, making a resist firmly adhere to the surface. The cooling apparatus 122 cools the wafers W to a predetermined temperature. The resist-coating apparatuses 124 apply a resist liquid to the surfaces of the wafers W, coating a resist film on each wafer W. The heating apparatus 126 heats the wafers W which have been coated with resist and which have been exposed to light. The developers 128 and 129 rotate the light-exposed wafers W and apply developing liquid to the wafers W, thereby developing the resist film on each wafer W.

The wafer-processing apparatuses 116, 118, 120, 122, 124, 126, 128 and 128 are arranged close to one another, at appropriate positions, so that they occupy but a relatively small space and operate with high efficiency. Wafers W are brought into and out of the apparatuses 9 to 14 by means of the transport arms 104 and 110.

As shown in FIG. 1, the system 100 further comprises a casing 130. The casing 130 contains the cassette station 102, transport arms 104 and 110, transport mechanism 106, transport path 108, arm tracks 112 and 114, and wafer-processing apparatuses 116, 118, 120, 122, 124, 126, 128 and 128.

The developers 128 and 129 are identical in structure. Only the first developer 128 will be described, with reference to FIG. 2. It should be noted that one liquid supplying device which is the first embodiment of the invention is provided for the developers 128 and 129.

Figure 2:
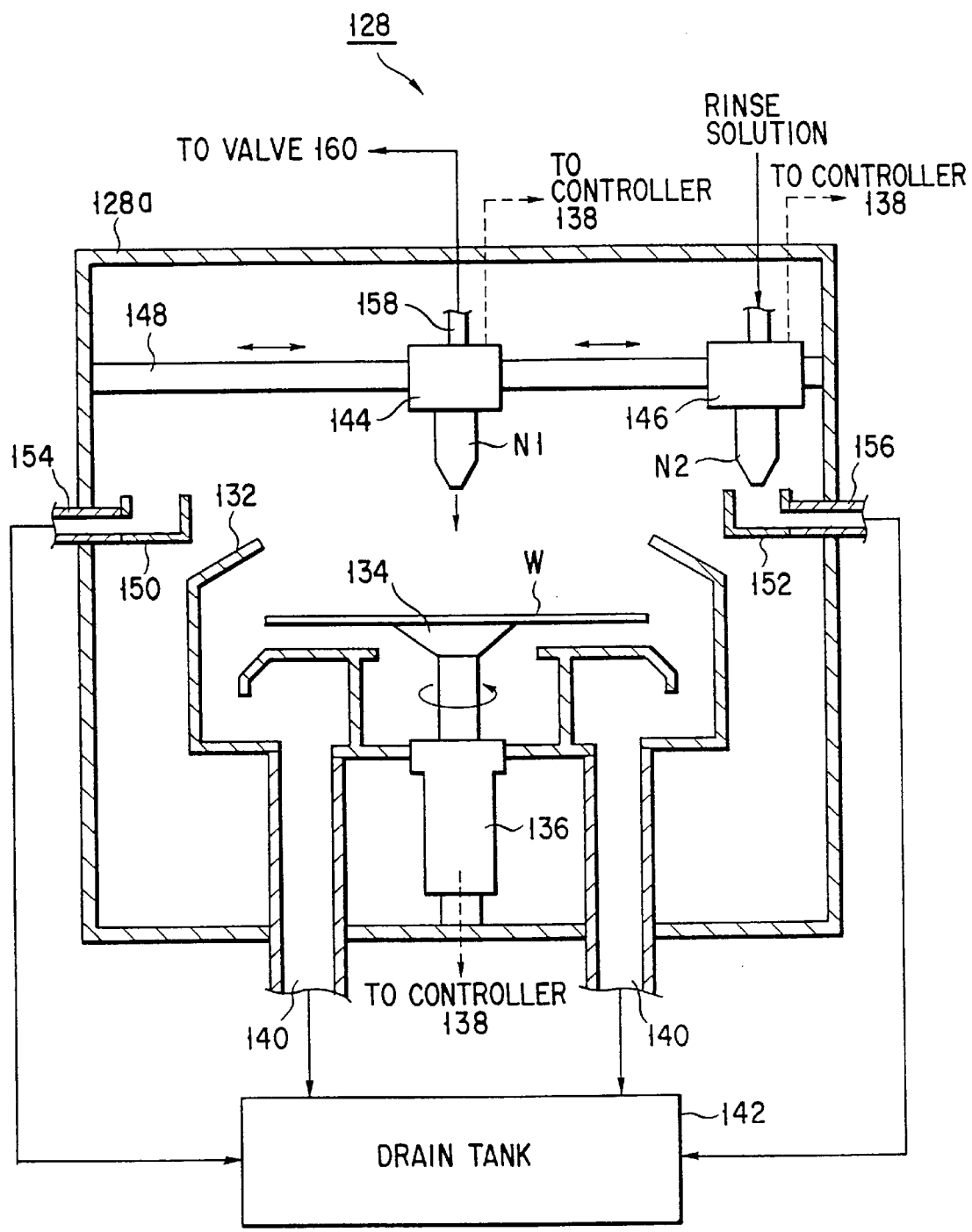
FIG. 2 is a schematic sectional view showing one of the developers which are shown in FIG. 1.

As FIGS. 1 and 2 show, the first developer 128 comprises a casing 128a. As shown in FIG. 2, the developer 128 has a processing chamber 132, a spin chuck 134, a chuck drive 136, and a drive controller 138, drain pipes 140, and a drain tank 142, which are provided in the casing 128a. The spin chuck 134 is provided in the chamber 132. The chuck drive 136 is located below the chamber 132. The drain pipes 140 extend from the bottom of the chamber 132 to the drain tank 142. The drain tank 142 is located outside the chamber 132.

Figure 3:
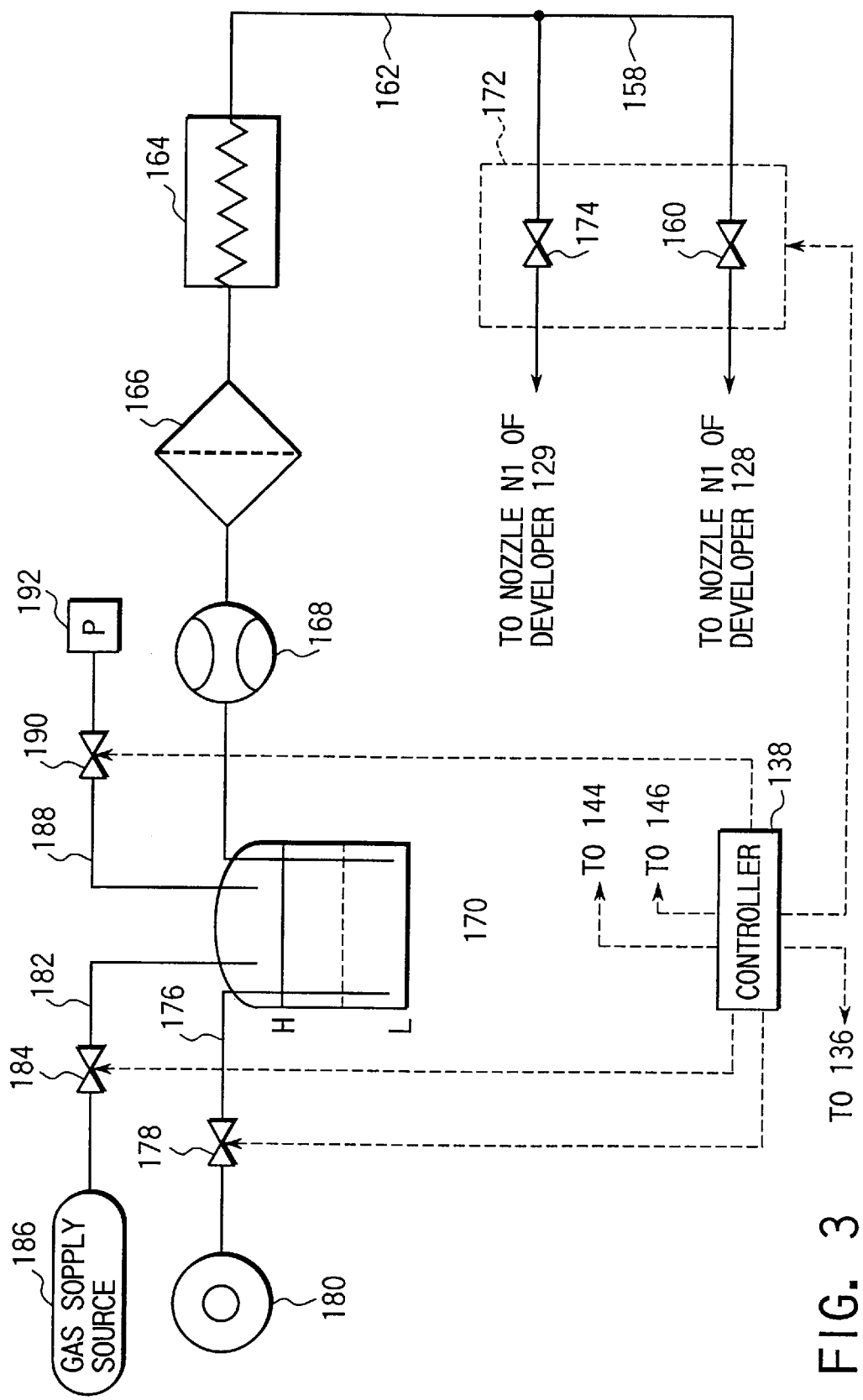
FIG. 3 is a schematic diagram of the liquid supplying device incorporated in the system illustrated in FIG. 2, for supplying a developing liquid to the developers.

The spin chuck 134 is designed to hold a wafer W in a horizontal position by vacuum suction. The chuck 134 can be rotated by the chuck drive 136. The chuck drive 136 is, for example, a pulse motor. The drive 136 is controlled by the controller 138, which is shown in FIG. 3. The controller 138 counts the pulse signal generated by an encoder (not shown) provided in the chuck drive 136. Hence, the drive 136 can rotate the spin chuck 134 at any controlled speed if an appropriate count is set in the controller 138.

Gases can be exhausted from the center part of the bottom of the processing chamber 132 by a gas-exhaust means (not shown) such as a vacuum pump, which is provided outside the processing chamber 132. The developing liquid and the rinse solution (i.e., pure water) can be drained through the drain pipes 140 into the drain tank 142.

As seen from FIG. 2, the developer 128 further comprises two nozzles N1 and N2, two nozzle holders 144 and 146, a pair of rails 148, two drain pans 150 and 152, and two drain pipes 154 and 156. The first nozzle N1 is provided to apply the developing liquid to the wafer W held by the spin chuck 134. The second nozzle N2 is provided to apply the rinse solution to the wafer W. The nozzles N1 and N2 are held by the nozzle holders 144 and 146, respectively. The nozzle holders 144 and 146 are slidably mounted on the rails 148, which horizontally extend between the opposite side walls of the casing 128a. The nozzle holders 144 and 146 contains a drive mechanism (not shown) each. The drive mechanisms are controlled by the controller 138 (FIG. 3). When driven under the control of the controller 138, the drive mechanisms drive the nozzles nozzle holders 144 and 146, respectively, in the horizontal direction along the rails 148.

The nozzle holders 144 and 146 stay at wait positions which are near the opposite side walls of the casing 128a, until the nozzles N1 and N2 need to apply the developing liquid and the rinse solution to the wafer W. The drain pans 150 and 152 are located below the wait positions of the nozzle holders 144 and 146, respectively. The drain pan 150 receives the developing liquid dripping from the first nozzle N1. The drain pan 152 receives the rinse solution dripping from the second nozzle N2. The drain pans 150 and 152 are connected to the drain pipes 154 and 156, respectively. The drain pipes 154 and 156 extend through the side walls of the casing 128a and connected to the drain tank 142.

As described above, the liquid supplying device, i.e., the first embodiment of the invention, is provided for both the developers 128 and 129. The liquid supplying device will be described with reference to FIG. 3.

As shown in FIG. 3, the liquid supplying device comprises a branch pipe 158 for supplying the developing liquid to the first nozzle N1 of the first developer 128. The branch pipe 158 is connected at one end to the first nozzle N1 of the first developer 128 by a valve 160. The other end of the branch pipe 158 is connected to a supply pipe 162. The supply pipe 162 is connected to a tank 170 which contains the developing liquid. A heat exchanger 164, a filter 166 and a flow rate adjuster 168 are provided on the supply pipe 162. The heat exchanger 164 is designed to maintain the developing liquid at a prescribed temperature such as 23° C. The filter 166 is provided to remove impurities from the developing liquid. The flow rate adjuster 168 is used to adjust the flow rate of the liquid to a desired value.

A branch pipe 172 is connected at one end to a valve 174, for supplying the developing liquid to the first nozzle N1 of the second developer 129. The other end of the branch pipe 172 is connected to the supply pipe 162 which is connected to the tank 170. Thus, the heat exchanger 164, filter 166 and flow rate adjuster 168, all provided on the supply pipe 162, are used to supply the developing liquid, not only to the nozzle N1 of the first developer 128 but also to the nozzle N1 of the second developer 129. The valves 160 and 174 are controlled by means of the controller 138, such that the value 160 is opened while the valve 174 is closed, and vice versa.

A developing liquid source 180 is connected to the tank 170 by a supply pipe 176, on which a valve 178 is provided. A gas source 186 is connected to the tank 170 by a gas supply pipe 182, on which a valve 184 is provided. Inert gas such as $N_2$ can be supplied from the gas source 182 through the pipe 182 and the valve 184 into the tank 170, to pressurize the tank 170 to a first prescribed pressure. Further, a vacuum suction unit 192 is connected to the tank 170 by an evacuation pipe 188, on which a valve 190 is provided. The vacuum suction unit 192 is designed to depressurize the tank 170 to a second prescribed pressure which is lower than the first prescribed pressure. The unit 192 is, for example, a vacuum pump.

An upper-limit level H and a lower-limit level L are set for the tank 170. The supply of the liquid from the source 180 to the tank 170 is started when the surface of the liquid in the tank 170 lowers to the lower-limit level L, and is stopped when the surface of the liquid in the intermediate tank rises to the upper-limit level H. The developing liquid is thus supplied into the tank 170 while neither the first developer 128 nor the second developer 129 is applying the developing liquid to the wafer W. Hence, the developing liquid can be replenished in the tank 170, without interrupting the application of the liquid to the wafer W.

The lower-limit level L is so set that the developing liquid remains in the tank 170 in an amount large enough for the wafers W of at least one lot when the surface of the liquid lowers to the lower-limit level L. Therefore, the developing process on the wafers W of the same lot is not interrupted even if the developing liquid cannot be replenished for some reason or other.

How the developers 128 and 129 and the liquid supplying device, all described above, operate will be explained, with reference to FIGS. 2 and 3.

In the first developer 128, a wafer W is mounted on the spin chuck 134 provided in the processing chamber 132. The spin chuck 134 holds the wafer W by vacuum suction. The chuck 134 rotates at a prescribed speed under the control of a control signal supplied from the controller 138. The wafer W is thereby rotated. The nozzle holder 144 is moved, bringing the nozzle N1 to a liquid-applying position right above the wafer W.

At this time, the developing liquid is filled in the tank 170 (FIG. 3) to the upper-limit level H. Furthermore, the tank 170 is pressurized to the first prescribed pressure with the $N_2$ gas supplied from the gas source 186. The liquid is supplied to the value 160 through the supply pipe 162 and the branch pipe 158. While the liquid is supplied through the supply pipe 162, its flow rate and temperature are adjusted by the flow rate adjuster 168 and the heat exchanger 164. In addition, the filter 166 removes impurities from the developing liquid. The developing liquid, thus set in desired conditions, is supplied to the nozzle N1 of the first developer 128 when the valve 160 is opened by a control signal supplied from the controller 138. The first nozzle N1 applies the liquid to the wafer W which is spinning.

Meanwhile, a wafer W is positioned in the second developer 129, too, in the same way as in the first developer 128. The developing liquid is set in desired conditions as in the first developer 128, so that as to be supplied to the nozzle Ni of the second developer 129.

When the wafer W is coated with a predetermined amount of the developing liquid in the first developer 128, the controller 138 supplies a control signal to the valve 160, the chuck drive 136 and the nozzle holder 144. The control signal closes the value 160, and the liquid is no longer supplied to the first nozzle N1. The control signal stops the chuck drive 136, whereby the spin chuck 134 stops rotating. The control signal drives the drive nozzle holder 144, moving the first nozzle N1 to the liquid-supplying position to the wait position.

In the first developer 128, the wafer W no longer spinning is left to stand for a predetermined time. The resist film on the wafer W is thereby developed. When it is ascertained that the nozzle N1 has been moved to the wait position and that the wafer W has been developed, the controller 138 supplies a control signal to the valve 174 and the chuck drive 136, opening the valve 174 and rotating the spin chuck 134 and spinning the wafer W. As a result, the second nozzle N2 applies rinse solution to the wafer W which is spinning, removing the developing liquid from the wafer W. More precisely, the control signal drives the drive mechanism contained in the nozzle holder 146. The nozzle holder 146 and, hence, the second nozzle N2 are moved to a solution-applying position right above the wafer W. When the valve 174 is opened, the rinse solution is supplied from a rinse solution source (not shown) to the second nozzle N2. The nozzle N2 applies the solution to the spinning wafer W for a prescribed time or in a predetermined amount, removing the developing liquid from the wafer W.

Even after the developing liquid has been removed from the wafer W, the wafer W is continuously spinned for a predetermined time, thereby expelling the rinse solution and drying the wafer W. Upon lapse of this time, the controller 138 supplies a control signal to the chuck drive 136, stopping the spin chuck 134. The wafer W is removed from the chuck 134 and transported from the first developer 128 to another system, in which it will be subjected to the next process.

After the wafer W is transported from the first developer 128, the resist film on another wafer W is developed and the developing solution is removed from the wafer W, thus drying the wafer W, in the second developer 129, exactly in the same way as in the first developer 128.

Thereafter, the next wafer W is transported into the first developer 128, and the resist film formed on the wafer W is developed as described above. Similarly, the next wafer W is transported into the second developer 129, and the resist film formed on the wafer W is developed as described above.

As described above, the liquid supplying device shown in FIG. 3, i.e., the first embodiment of the invention, supplies the developing liquid to the first developer 128 at one time and to the second developer 129 at another time. In other words, the liquid is applied to a wafer W in one developer, while the liquid is not applied to a wafer W in the other developer. This helps to maintain the pressure in the tank 170 at a desired value. The developing liquid can therefore be applied under the same pressure to a wafer W in both developers 128 and 129. Moreover, if the first developer 128 fails to finish the developing process on a wafer W within a predetermined time due to some cause, the second developer 129 is prohibited from start the developing process.

How the values 160 and 174 are controlled to supply the developing liquid to the developers 128 and 129 will be described with reference to the timing chart of FIG. 4. Also, how the developing liquid is replenished in the tank 170 will be explained with reference to FIG. 4.

As described above, the developing liquid is supplied to the first developer 128 and then to the second developer 129. The liquid is supplied alternately to the developers 128 and 129, as long as wafers W of at least one lot are subjected in the developing process in the developers 128 and 129. Therefore, as shown in FIG. 4, the valve 160 is opened and closed, the valve 174 is then opened and closed, the valve 160 is again opened and closed, the vale 174 is again opened and closed, and so forth. The valve 160 remains closed for some time until it is opened again, and so does the value 174. This is inevitable because it takes some time to process each wafer W in the resist-coating apparatuses 124, heating apparatus 126 and the like and the developers 128 and 129.

The tank 170 is pressurized to the first prescribed pressure. The developing liquid in the tank 170 is thereby forced from the tank 170 into the developers 128 and 129. The liquid supplying device of FIG. 3 is designed to replenish the developing liquid in the tank 170 while both valves 160 and 174 are closed, or while the liquid is not being supplied to the apparatus 128 or the apparatus 129.

That is, the valve 184 is closed while the valves 160 and 174 remain closed, thereby stopping the supply of the inert gas into the tank 170 from the gas source 186. At the same time, the vacuum suction unit 192 is driven and the valve 190 is opened. The tank 170 is thereby depressurized to the second prescribed pressure. As a result, the developing liquid is replenished in the tank 170 until the surface of the liquid rises to the upper-limit level H. Thereafter, the valves 178 and 190 are closed, and the valve 184 is opened again. The tank 170 is thereby pressurized to the first prescribed pressure. The valves 178, 184 and 190 are opened and closed by control signals supplied from the controller 138.

Figure 4:
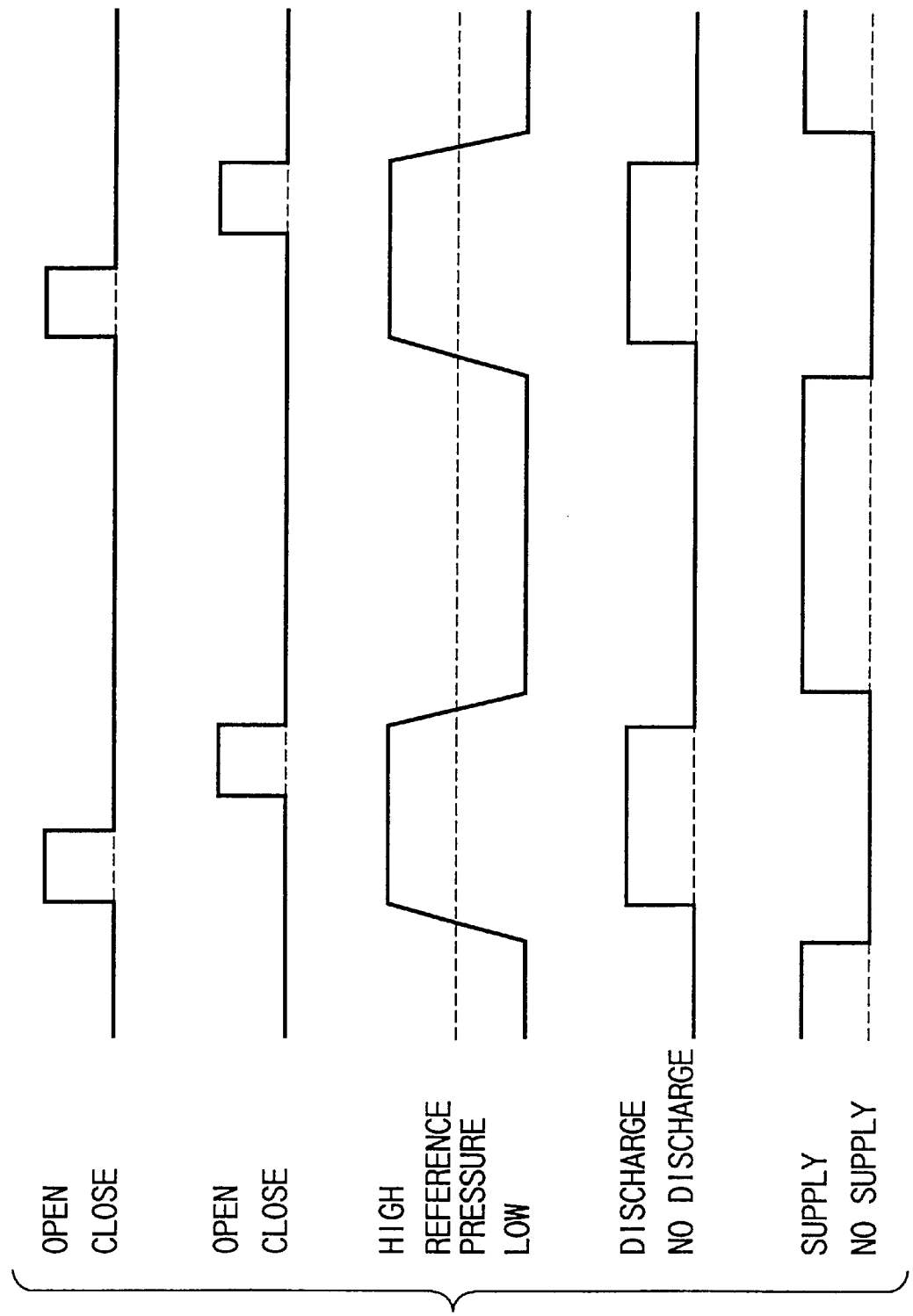
FIG. 4 is a timing chart representing when the valves provided in the device of FIG. 3 are opened and closed.

As can be understood from FIG. 4, the tank 170 is depressurized to the second prescribed pressure as long as both the valve 160 and the valve 174 remain closed. Also as seen from FIG. 4, the tank 170 is pressurized to the first prescribed pressure before the valves 160 and 174 remain open.

Since the liquid supplying device (FIG. 3) is used to supply the developing liquid to both developers 128 and 129, the resist-coating and -developing system 100 (FIG. 1) is smaller than otherwise. The system 100 can be manufactured at a lower cost, can be more easily maintained, and can be operated with a higher efficiency than in the case where the system 100 has two devices for supplying the developing liquid to the developers 128a and 129, respectively.

A liquid supplying device of another type, i.e., the second embodiment of the invention, will now be described with reference to FIG. 5.

Figure 5:
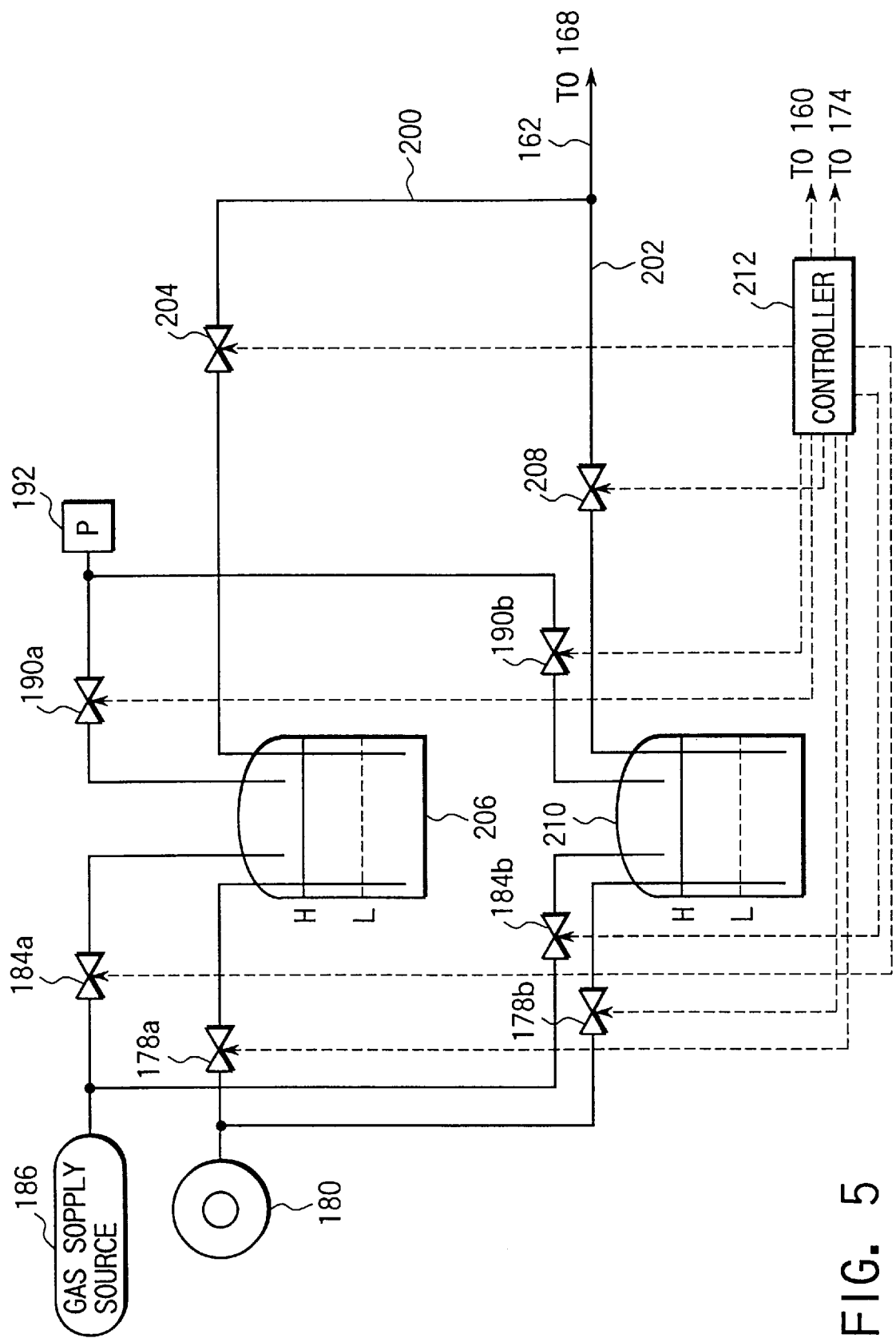
FIG. 5 is a schematic diagram of a liquid supplying device which is the second embodiment of the present invention.

As shown in FIG. 5, this liquid supplying device has two tanks 202 and 210, not one tank as in the first embodiment shown in FIG. 3. Therefore, the components identical to those of the first embodiment are designated at the same reference numerals and will not be described in detail.

A supply pipe 162 is connected at one end to a flow rate adjuster 168. Branch pipes 200 and 202 are connected at one end to the other end of the supply pipe 162. The first branch pipe 200 is connected at the other end to the first tank 206. The second branch pipe 202 is connected at the other end to the second tank 210. Two valves 204 and 208 are provided on the branch pipes 200 and 202, respectively.

As shown in FIG. 5, a developing liquid source 180 is connected to the first tank 206 by a valve 178a and to the second tank 210 by a valve 178b. A gas source 186 is connected to the first tank 206 by a valve 184a and to the second tank 210 by a valve 184b. A vacuum suction unit 192 is connected to the first tank 206 by a valve 190a and to the second tank 210 by a valve 190b. The valves 178a, 178b, 184a, 184b, 190a and 190b are opened and closed by control signals supplied from a controller 212. The controller 212 supplies control signals to valves 160 and 174 (not shown) to open and close the valves 160 and 174. As in the first embodiment, the valve 160 is connected to the first nozzle N1 of a developer of the type shown in FIG. 3, and the valve 174 to the nozzle N1 of another developer of the same type.

Figure 6:
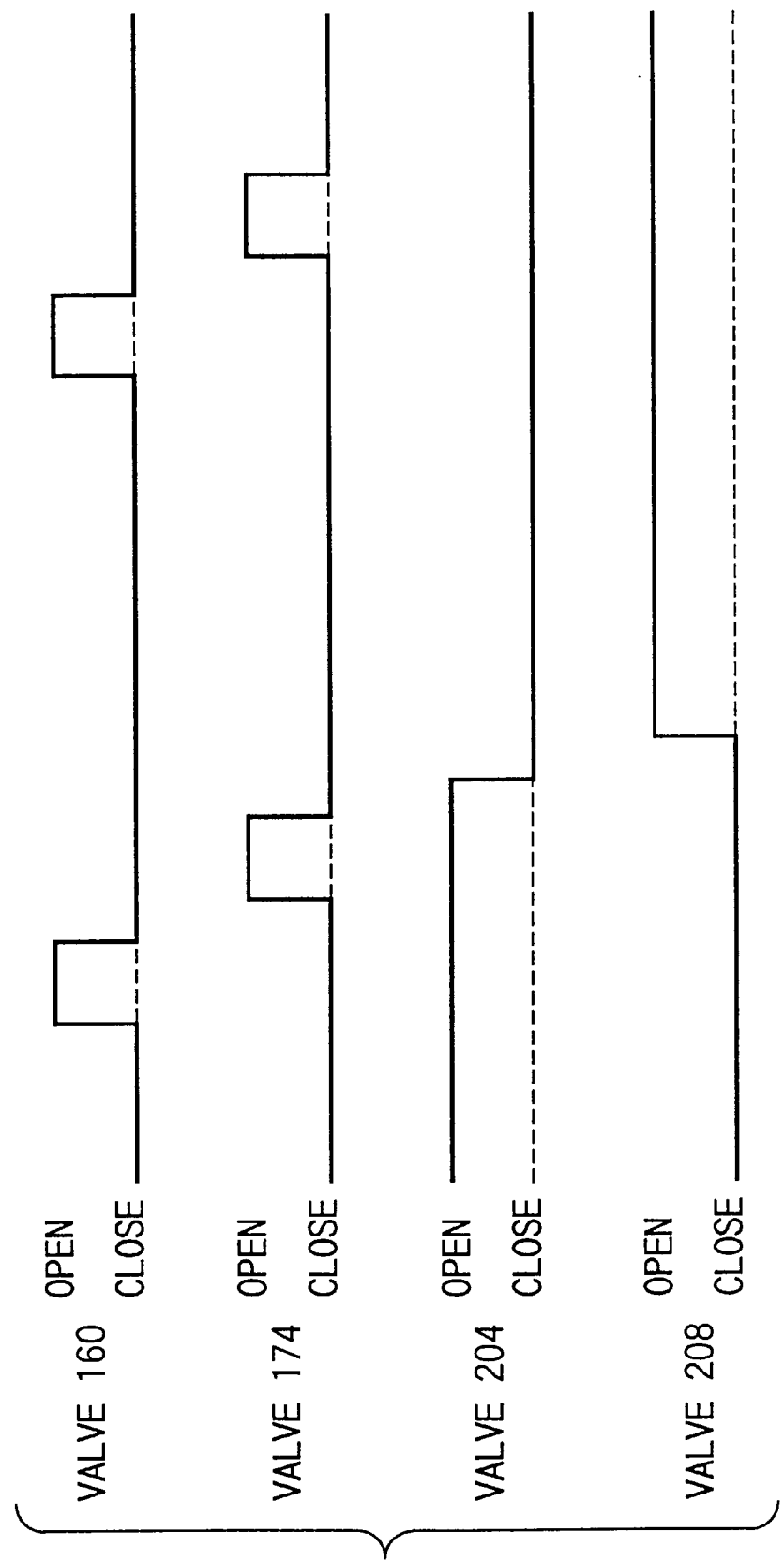
FIG. 6 is a timing chart representing when the valves provided in the device of FIG. 5 are opened and closed.

The controller 212 controls the valves 160 and 174 such that the value 160 is opened while the valve 174 is closed, and vice versa, as illustrated in FIG. 6. Thereafter, the valves 202 and 208 are respectively closed and opened by control signals supplied from the controller 212 when the surface of the developing liquid in the first tank 206 falls to a lower-limit level L. The valves 202 and 208 remain closed and opened, respectively, until the valves 160 and 174 are opened and closed again. As a result, the developing liquid can be supplied to the nozzles N1 of the two developers from the second tank 210 in which the developing liquid is filled to an upper-limit level H, not from the first tank 206. In other words, switching from the first tank 206 to the second tank 210 is achieved, without adversely influencing the developing process.

The upper-limit level H and the lower-limit level L are set for both tanks 206 and 210, in the same way for the tank 170 shown in FIG. 3.

Immediately after the switching from the first tank 206 to the second tank 210, the developing liquid supplied from the first tank 206 remains in the supply pipe 162 connected to both developer 128 and 129. The developing liquid may be drained from the pipe 162 while the developing process is interrupted right after the switching from the first tank 206 to the tank 210. More specifically, the developing liquid may be ejected from the first nozzle N1 of, for example, the first developer 128 (FIG. 2), into the drain pan 150, and may be hence supplied into the drain tank 142 through the drain pipe 154. Therefore, no developing liquid remains in the pipe 162 for a long time to degenerate, and nothing detrimental to the developing process would happen at all.

Both the first embodiment and the second embodiment described above are designed to supply the developing liquid to two developers 128 and 129. The present invention is not limited to devices which supply a developing liquid to two developers. The invention can be applied to a liquid supplying device for supplying a developing liquid to three or more developers.

Nor is the present invention limited to devices which supply a developing liquid to developers. The invention can be applied also devices which supply liquids to various coating apparatus. Furthermore, the objects to which liquids are applied are not limited to wafers. Rather, the objects may be, for example, glass substrates of LCDs (Liquid Crystal Displays).

A liquid supplying device according to the third embodiment of the invention will be described. This device is designed to supply a developing liquid to two developers 128' and 129' which may be incorporated in the resist-coating and -developing system 100 shown in FIG. 1. The first developer 128' and the second developer 129' are identical in structure. Only the first developer 128' will be described, with reference to FIG. 7.

Figure 7:
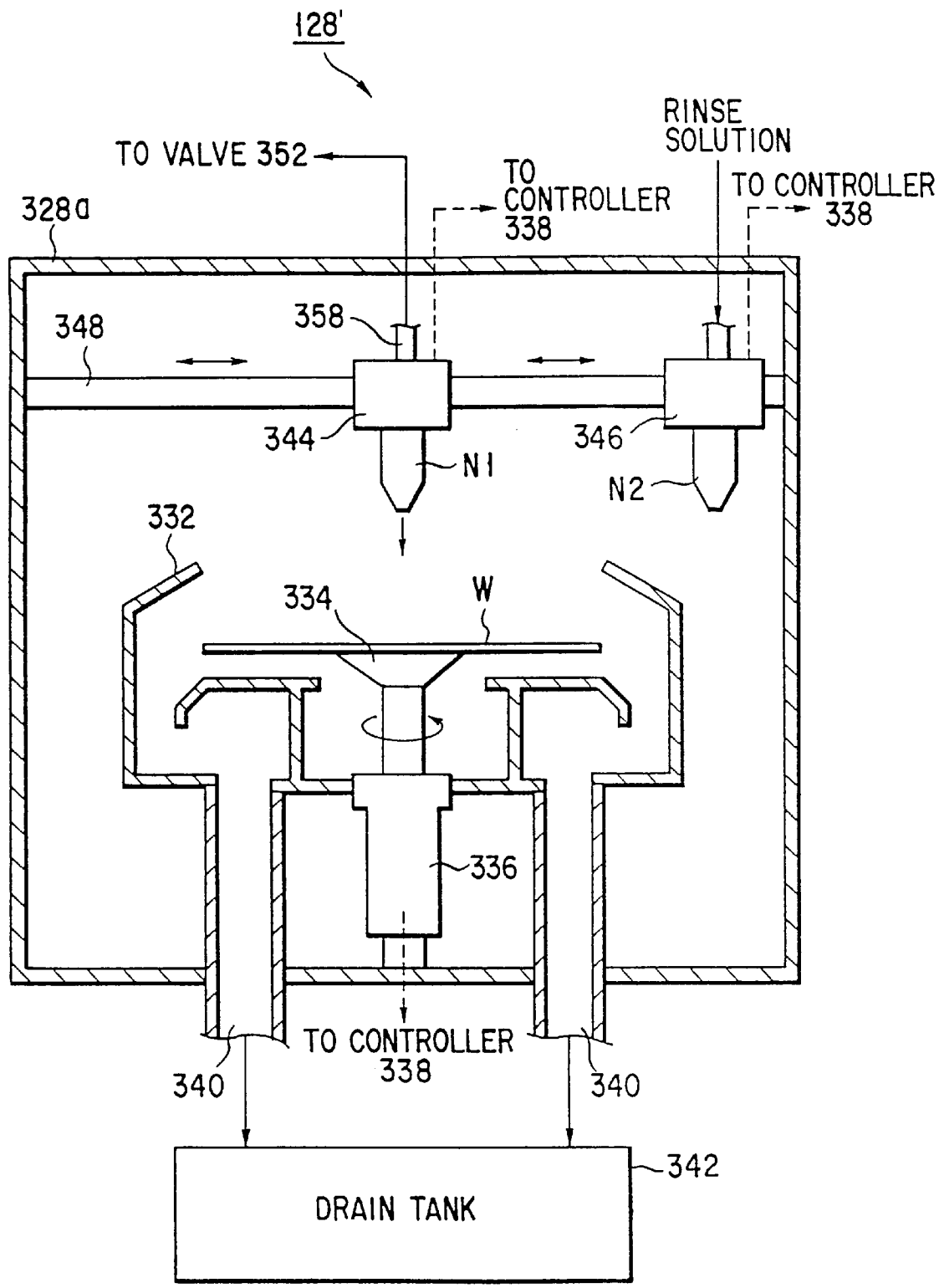
FIG. 7 is a schematic sectional view showing one of two identical developers which may be incorporated in the resist-coating and -developing system shown in FIG. 1, instead of the developers illustrated in FIG. 2.

As shown in FIG. 7, the developer 128' a processing chamber 332, a spin chuck 334, a chuck drive 336, and a drive controller 338, drain pipes 340, and a drain tank 342, which are provided in the casing 328a. The spin chuck 334 is provided in the chamber 332. The chuck drive 336 is located below the chamber 332. The drain pipes 340 extend from the bottom of the chamber 332 to the drain tank 342. The drain tank 342 is located outside the chamber 332.

Figure 8:
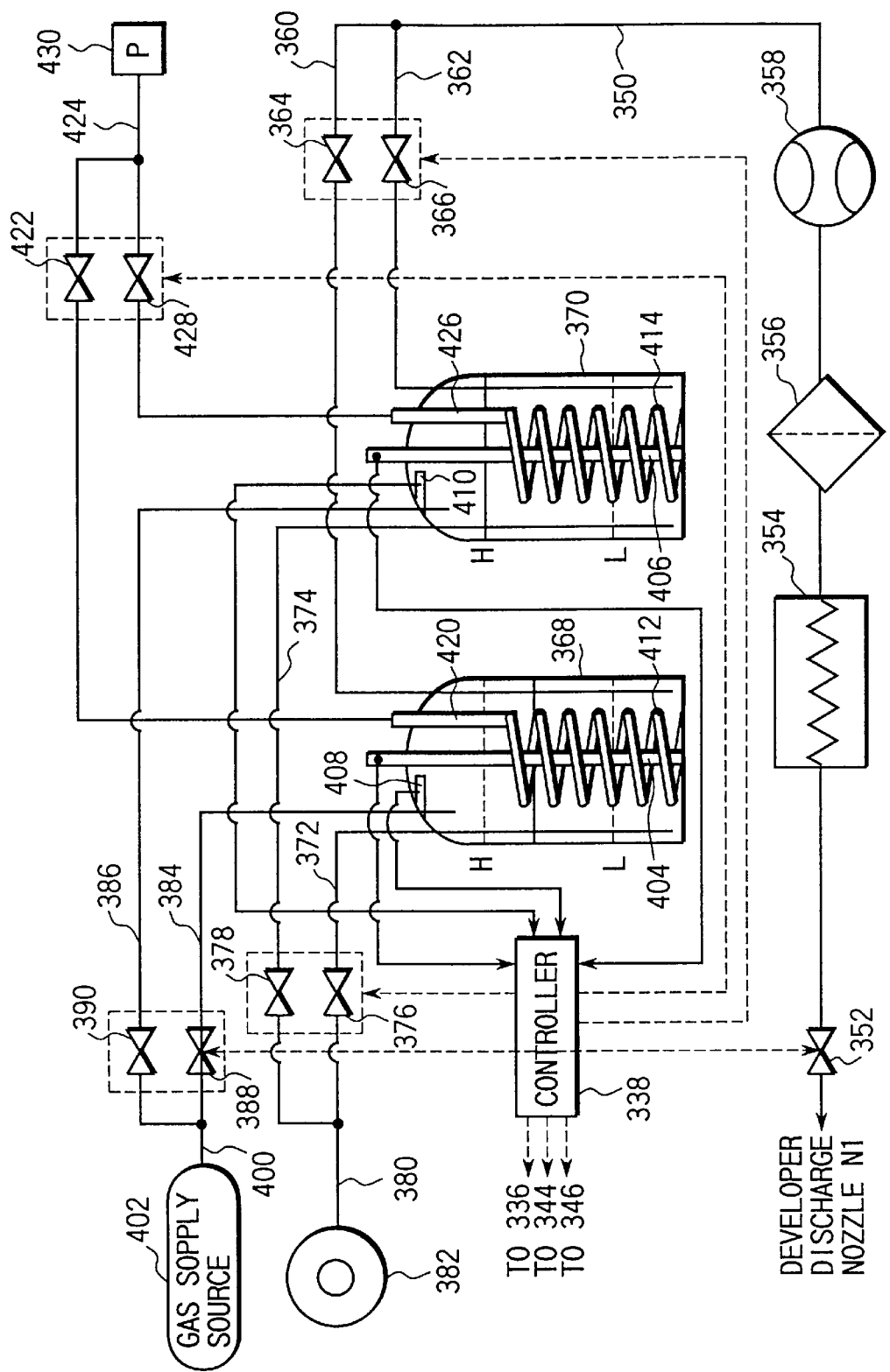
FIG. 8 is a schematic diagram showing the liquid supplying device which supplies a developing liquid to the developers shown in FIG. 7 and which is the third embodiment of the invention.

The spin chuck 334 is designed to hold a wafer W in a horizontal position by vacuum suction. The chuck 334 can be rotated by the chuck drive 336. The chuck drive 336 is, for example, a pulse motor. The drive 336 is controlled by the controller 338, which is shown in FIG. 8. The controller 338 counts the pulse signal generated by an encoder (not shown) provided in the chuck drive 336. Hence, the drive 336 can rotate the spin chuck 334 at any controlled speed if an appropriate count is set in the controller 338.

Gases can be exhausted from the center part of the bottom of the processing chamber 332 by a gas-exhaust means (not shown) such as a vacuum pump, which is provided outside the processing chamber 332. The developing liquid and the rinse solution (i.e., pure water) can be drained through the drain pipes 340 into the drain tank 342.

As seen from FIG. 7, the developer 128' further comprises two nozzles N1 and N2, two nozzle holders 344 and 346, and pair of rails 348. The first nozzle N1 is provided to apply the developing liquid to the wafer W held by the spin chuck 334. The second nozzle N2 is provided to apply the rinse solution to the wafer W. The nozzles N1 and N2 are held by the nozzle holders 344 and 346, respectively. The nozzle holders 344 and 346 are slidably mounted on the rails 348, which horizontally extend between the opposite side walls of the casing 328a. The nozzle holders 344 and 346 contains a drive mechanism (not shown) each. The drive mechanisms are controlled by the controller 338 (FIG. 8). When driven under the control of the controller 338, the drive mechanisms drive the nozzles nozzle holders 344 and 346, respectively, in the horizontal direction along the rails 348.

The nozzle holders 344 and 346 stay at wait positions which are near the opposite side walls of the casing 328a, until the nozzles N1 and N2 need to apply the developing liquid and the rinse solution to the wafer W. The nozzle holders 344 and 346 are moved to liquid-applying positions which are right above the center of the wafer W as is illustrated in FIG. 7.

The third embodiment of the invention, the liquid supplying device provided for both the developers 128' and 129', will be described with reference to FIG. 8.

As shown in FIG. 8, this liquid supplying device comprises a supply pipe 350, which is connected at one end to the nozzles N1 of the developers 128' and 129'. A valve 352, a heat exchanger 354, a filter 356 and a flow rate adjuster 358 are provided on the supply pipe 350. The heat exchanger 354 is designed to maintain the developing liquid at a prescribed temperature such as 23° C. The filter 356 is provided to remove impurities from the developing liquid. The flow rate adjuster 358 is used to adjust the flow rate of the liquid to a desired value.

The other end of the supply pipe 350 is connected to branch pipes 360 and 362. The branch pipe 360 is connected by a value 364 to a first intermediate tank 368. Similarly, the branch pipe 362 is connected by a valve 366 to a second intermediate tank 270. The valves 352, 364 and 366 are opened and closed by control signals supplied from the controller 338.

Two more branch pipes 372 and 374 are connected at one end to the intermediate tanks 368 and 370, respectively. These branch pipes 372 and 374 are connected at the other end to one end of a supply pipe 380. Valves 376 and 378 are provided on the branch pipes 372 and 374, respectively. The supply pipe 380 is connected at the other end to a developing liquid source 382. The developing liquid can be supplied from the source 382 through the valves 376 to 378 to the intermediate tanks 368 and 370, respectively, to replenish the developing liquid in the intermediate tanks 368 and 370.

Still two other branch pipes 384 and 386 are connected at one end to the intermediate tanks 268 and 370, respectively. The branch pipes 384 and 386 are connected at the other end to one end of a supply pipe 400. The supply pipe 400 is connected at the other end to a gas source 402. Valves 388 and 390 are provided on the branch pipes 384 and 386, respectively. Inert gas such as $N_2$ can be supplied from the gas source 402 through the valve 388 into the first intermediate tank 368 to pressurize the tank 368 to a prescribed pressure, and through the valve 390 into the second intermediate tank 370 to pressurize the tank 370 to a prescribed pressure. The valves 388 and 390 are opened and closed by control signals supplied from the controller 338.

Rod-shaped level sensors 404 and 406 stand upright from the bottoms of the intermediate tanks 368 and 370 and extend substantially in the axes of the tanks 368 and 370, respectively. The level sensors 404 and 406 are, for example, float sensors or optical sensors. The first level sensor 404 is provided to detect the surface level of the developing liquid in the first intermediate tank 368. The second level sensor 406 is provided to detect the surface level of the developing liquid in the second intermediate tank 370. Pressure sensors 408 and 410 are provided on the inner top surfaces of the intermediate tanks 368 and 370, respectively. The first pressure sensor 408 detects the pressure in the first intermediate tank 368, generating a signal presenting the pressure detected. The second pressure sensor 410 detects the pressure in the second intermediate tank 370, generating a signal presenting the pressure detected. The signals the pressure sensors 408 and 410 are supplied to the controller 338.

An upper-limit level H and a lower-limit level L are set for either intermediate tank. The upper-limit H levels for the tanks 368 and 370 are the same. So are the lower-limit levels L for the tanks 368 and 370. In either intermediate tank, the developing liquid can be replenished and degassed while the surface of the liquid remain between the upper-limit level H and the lower-limit level H. While the surface of the liquid stays between the levels H and L, the either intermediate tank can be pressurized to a prescribed pressure to supply the developing liquid to both developers 128' and 129'. The lower-limit level L is set so that the developing process can be performed on the wafers W of at least one lot even if switching from, for example, the tank 268 to the tank 370 cannot be accomplished for some reason or other.

Degassing members 412 and 414 are provided in the intermediate tanks 368 and 370, respectively. The degassing members 412 and 414 have the same structure. Only the first degassing member 412 will be described with reference to FIGS. 9 and 10.

Figure 9:
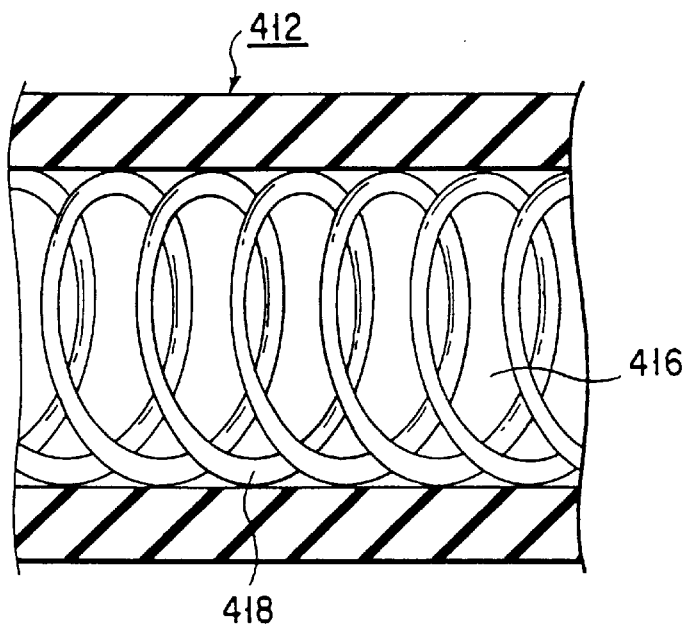
FIG. 9 is a sectional view showing a part of one of the identical degassing members incorporated in the liquid supplying device shown in FIG. 8.

As shown in FIG. 9, the degassing member 412 is a flexible tube made of material, such as PTEE, PFA or FEP, which passes gas but not liquid. A spiral wire 418 is inserted in the degassing member 412. The spiral wire 418 prevents the member 412 from collapsing when the member 412 is depressurized to degass the developing liquid in the first intermediate tank 368.

Figure 10:
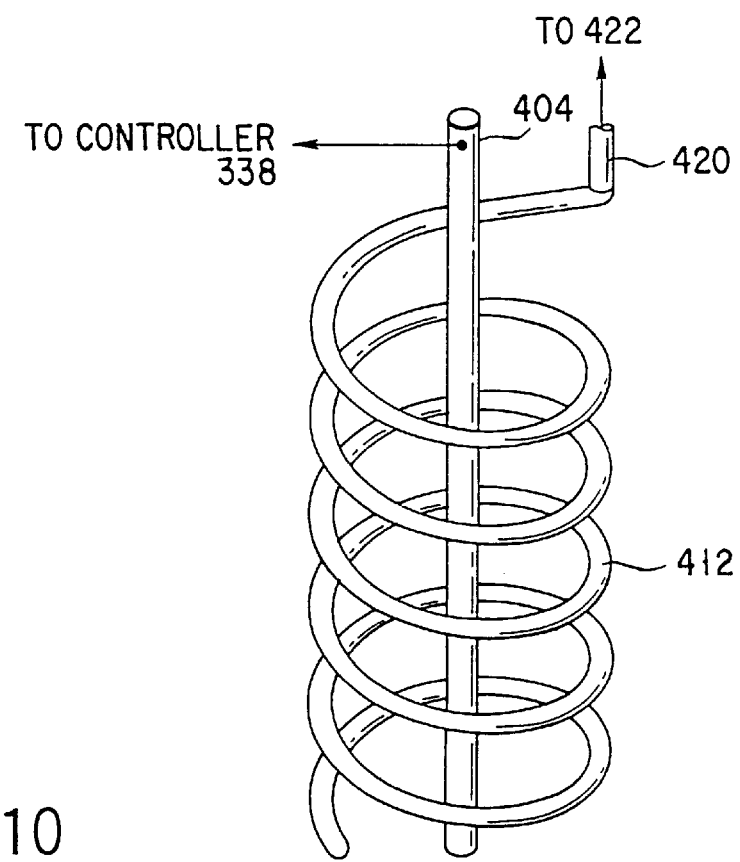
FIG. 10 is a perspective view of the degassing member illustrated in FIG. 9.

As seen form FIG. 10, the degassing member 412 is wound around the first level sensor 404, forming a spiral in the intermediate tank 368. The upper portion of the member 412 is located a little below the upper-limit level H, and the lower end of the member 412 is positioned near the bottom of the intermediate tank 368. Hence, the surface area of the member 412 which contacts the developing liquid (hereinafter called degassing area) much increases when the developing liquid is filled in the tank 368 to the upper-limit level H. It follows that the developing liquid can be degassed very efficiently when it is filled the tank 368 to the upper-limit level H. Being a spiral, the degassing member 412 provides a space, making it easy to arrange the first level sensor 404 in the first intermediate tank 368.

The degassing member 412 is connected at upper end to one end of a branch pipe 420. Similarly, the degassing member 414 provided in the second intermediate tank 370 is connected at upper end to one end of a branch pipe 426. As shown in FIG. 8, the branch pipes 420 and 426 are connected at the other end to one end of an evacuation pipe 424, by valves 422 and 428, respectively. The other end of the evacuation pipe 424 is connected to a vacuum suction unit 430 as a vacuum pump. The valves 422 and 428 are opened and closed by control signals supplied from the controller 338.

How the developing liquid is supplied from the liquid supply device shown in FIG. 8 to, for example, the developer 128' will be explained, with reference to FIGS. 7 and 8.

It will be explained how the liquid is replenished in the first intermediate tank 368 (FIG. 8) and how the liquid is supplied to the developer 128' (FIG. 7).

First, the vacuum suction unit 430 is driven and the valve 422 is opened. The first intermediate tank 368 is thereby depressurized to the prescribed pressure by the use of the degassing member 412. The valve 364 which connects the branch pipe 360 to the intermediate tank 368 is closed until the developing liquid is supplied from the tank 368 to the developer 128'.

Then, the valve 376 is opened while the first intermediate tank 368 is being depressurized by means of the degassing 412. (As mentioned above, the valve 376 is provided on the branch pipe 372 connecting the tank 368 to the supply pipe 380, which in turn is connected the developing liquid source 382. ) The developing liquid is thereby supplied from the developing liquid source 382 into the first intermediate take 368. When the surface of the liquid in the tank 368 rises to the upper-limit level H, the valve 376 is closed, stopping the replenishing of the liquid in the intermediate tank 368. Now completely immersed in the developing liquid, the degassing member 412 degasses the developing liquid. It is desired that the time for which the member 412 degasses the liquid (i.e., the amount of gases removed from the liquid) be preset on the basis of the operating conditions of the developers 128' and 129' and the type of the developing liquid.

When the developing liquid in the first intermediate tank 368 is degassed to a desired extent, the valve 422 is closed and the valve 388 is opened. Since the valve 388 is provided on the branch pipe 384 which connects the gas source 402 to the intermediate tank 368, the inert gas (e.g., $N_2$) is supplied from the as source 402 into the intermediate tank 368. The first intermediate tank 368 is thereby pressurized to the prescribed pressure. As a result, the developing liquid can be supplied from the first intermediate tank 68 to the developer 128'.

The pressure sensor 408 keeps detecting the pressure in the first intermediate tank 368 and generating a signal representing the pressure detected. The signal is from the sensor 408 to the controller 338. The controller 338 opens and closes the valves 376, 388 and 422 in accordance with the signal output from the pressure sensor 408. Hence, the pressure in the first intermediate tank 368 is maintained at a desired value.

The developing liquid is replenished in the second intermediate tank 370 and supplied therefrom to the developer 128' in the same manner as in and from the first intermediate tank 368. That is, the vacuum suction unit 430 is driven and the valve 428 is opened. The second intermediate tank 370 is thereby depressurized to the prescribed pressure by the use of the degassing member 414. The valve 366 which connects the branch pipe 362 to the second intermediate tank 370 is closed until the developing liquid is supplied from the tank 370 to the developer 128'.

Then, the valve 378 is opened while the tank 370 is being depressurized by means of the degassing 414. (The valve 378 is provided on the branch pipe 374 connecting the tank 370 to the supply pipe 380, which in turn is connected the developing liquid source 382.) The developing liquid is thereby supplied from the developing liquid source 382 into the second intermediate take 370. When the surface of the liquid in the tank 370 rises to the upper-limit level H, the valve 378 is closed, stopping the replenishing of the liquid in the second intermediate tank 370. Now completely immersed in the developing liquid, the degassing member 414 degasses the developing liquid for the time which has been preset, as has been described, on the basis of the operating conditions of the developers 128' and 129' and the type of the developing liquid.

When the developing liquid in the second intermediate tank 370 is degassed to a desired extent, the valve 428 is closed and the valve 390 is opened. Since the valve 390 is provided on the branch pipe 386 which connects the gas source 402 to the second intermediate tank 370, the inert gas (e.g., $N_2$) is supplied from the gas source 402 into the intermediate tank 370. The second intermediate tank 380 is thereby pressurized to the prescribed pressure. As a result, the developing liquid can be supplied from the second intermediate tank 370 to the developer 128'.

The pressure sensor 410 keeps detecting the pressure in the second intermediate tank 370 and generating a signal representing the pressure detected. The signal is from the sensor 410 to the controller 338. The controller 338 opens and closes the valves 378, 390 and 428 in accordance with the signal output from the pressure sensor 410. Hence, the pressure in the second intermediate tank 370 is maintained at a desired value.

How the developers 128' and 129' and the liquid supplying device shown in FIG. 8 operate will be explained, with reference to FIGS. 7 and 8.

In the first developer 128', a wafer W is mounted on the spin chuck 334 provided in the processing chamber 332. The spin chuck 334 holds the wafer W by vacuum suction. The chuck 334 rotates at a prescribed speed under the control of a control signal supplied from the controller 338. The wafer W is thereby rotated. The nozzle holder 344 is moved, bringing the first nozzle N1 to a liquid-applying position right above the wafer W.

To supply the developing liquid from the first intermediate tank 368 to the first developer 128', thereby to apply the liquid from the first nozzle N1 to the wafer W, the valves 364 and 352 are opened. The developing liquid is thereby guided from the tank 368 to the first nozzle N1 through the branch pipe 360, valve 364, and supply pipe 350. The liquid is further guided through the flow rate adjuster 358, filter 356 and heat exchanger 354 which are provided on the supply pipe 350. The flow rate adjuster 358 adjusts the flow rate of the liquid, the filter 356 removes impurities from the liquid, and the heat exchanger 354 changes the temperature of the liquid to the prescribed value. The developing liquid, thus set in desirable conditions, is supplied through the valve 352 to the first nozzle N1. The nozzle N1 applies the developing liquid in a predetermined amount onto the wafer W held by the spin chuck 334 and spinning at the prescribed speed. When the liquid is applied in the predetermined mount to the wafer W, the valve 352 is closed.

The liquid spreads on the surface of the wafer W due to the centrifugal force acting on the wafer W and is uniformly coated on the surface of the wafer. Then, chuck drive 336 stops rotating the spin chuck 334, whereby the wafer W is stopped. The wafer W is left to stand for a predetermined time, during which the resist film on the wafer is developed with the developing liquid.

Thereafter, the chuck drive 336 rotates the spin chuck 334 again, spinning the wafer W. The nozzle holder 346 is moved, bringing the second nozzle N2 to the solution-applying position right above the wafer W. Rinse solution (e.g., pure water) is supplied from a rinse solution source (not shown) to the second nozzle N2. The nozzle N2 applies the rinse solution in a prescribed amount onto the wafer W, removing the developing liquid from the wafer W. The spin chuck 334 is kept rotating for some time thereafter. The rinse solution is expelled from the wafer W due to the centrifugal force acting on the wafer W. The wafer W is thereby dried.

Upon lapse of a predetermined time, the controller 338 supplies a control signal to the chuck drive 336. In response to the signal the chuck drive 336 stops the spin chuck 334, whereby the wafer W is stopped. The wafer W is removed from the spin chuck 334 and transported from the first developer 128' to another system, in which it will be subjected to the next process.

After the wafer W is transported from the first developer 128', the next wafer W is transported into the first developer 128' and held by the spin chuck 334. The developing process is performed on this wafer W in the same way as described above.

As the developing process is conducted on wafers W, one after another, in the first developer 128', the developing liquid gradually decreases in the first intermediate tank 368. After the level sensor 404 detects that the surface of the liquid falls to a level close to the lower-limit level L and while the first nozzle N1 is applying no developing liquid to a wafer W, the controller 338 closes the valve 364. Upon lapse of a prescribed time, the controller 338 opens the valve 366. As a result, switching is achieved from the first intermediate tank 368 to the second intermediate tank 370, without interrupting the developing process.

Thereafter, the developing liquid is supplied from the second intermediate tank 370 to the first developer 128'. While the liquid is being supplied from the second intermediate tank 370 to the first developer 129', the developing liquid is replenished in the first intermediate tank 369 until the surface of the liquid rises to the upper-limit level H. The developing liquid in the first intermediate tank 368 is degassed while it is replenished in the tank 368 and even after its surface rises to the upper-limit level H. Then, inert gas is introduced into the intermediate tank 368, pressurizing the tank 368 to the prescribed pressure, so that the developing liquid may be supplied to both developers 128' and 129'.

After the level sensor 404 detects that the surface of the liquid in the second intermediate tank 370 falls to a level close to the lower-limit level L and while the first nozzle N1 is applying no developing liquid to a wafer W, the controller 338 closes the valve 366. Upon lapse of a prescribed time, the controller 338 opens the valve 364. Switching is thereby achieved from the second intermediate tank 370 to the first intermediate tank 368, without interrupting the developing process.

As indicated above, the degassing members 412 and 414 are positioned in the intermediate tanks 368 and 370, respectively, so that they are immersed in the developing liquid contained in the tanks 368 and 370. The members 412 and 414 can therefore degass the developing liquid with high efficiency. In addition, since the members 412 and 414 are flexible tubes, each bent in the form of a spiral, the level sensors 404 and 406 can be more easily arranged than otherwise, in the intermediate tanks 368 and 370. Furthermore, each degassing member would not collapse when it depressurized by the vacuum suction unit 430 to degass the developing liquid, because a spiral wire 418 is inserted in the degassing member.

Figure 11:
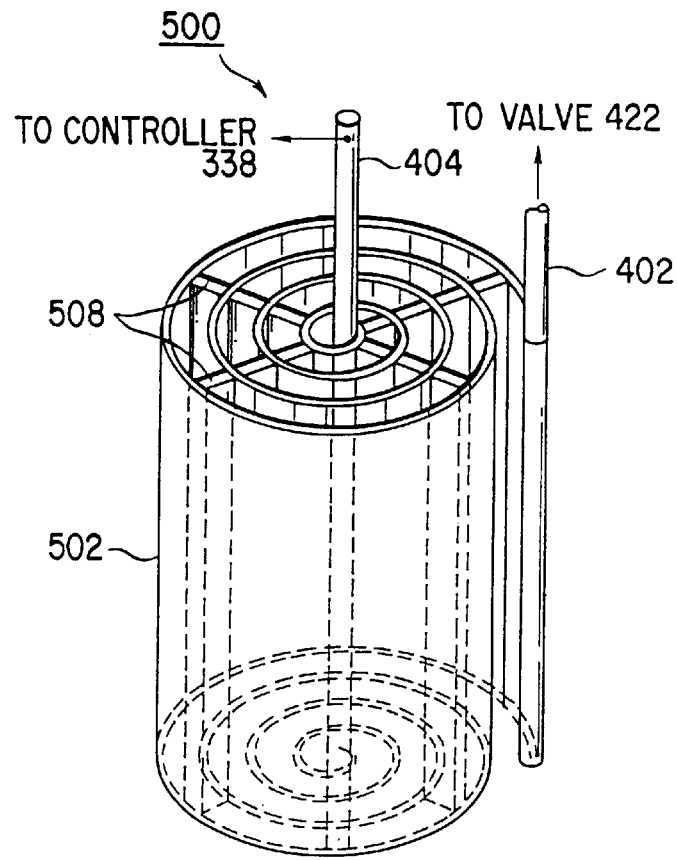
FIG. 11 is a perspective view of one of the degassing members used in a liquid supplying device according to a fourth embodiment of the invention.

A liquid supplying device according to the fourth embodiment of this invention will be described. The device is identical to the third embodiment shown in FIG. 8, except that intermediate tanks 368 and 370 contain each a degassing member 500 of the type shown in FIG. 11. Only the degassing member 500 provided in the first intermediate tank 368 will be described, with reference to FIGS. 11 and 12.

Figure 12:
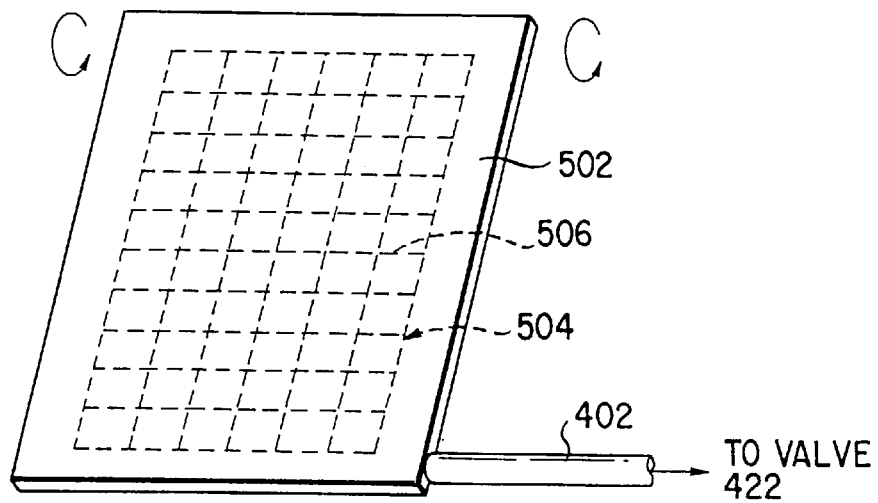
FIG. 12 is a schematic perspective view of the degassing member shown in FIG. 11.

As shown in FIG. 12, the degassing member 500 comprises a flexible sheet 502 and a wire mesh 506. The sheet 502 is made of material, such as PTEE, PFA or FEP, which passes gas but not liquid. The layers are bonded together, defining a space 504. The wire mesh 506 is inserted in the space 504, preventing the space 504 from collapsing when the member 500 is depressurized to degass the developing liquid in the first intermediate tank 368.

The flexible sheet 502 is connected at one edge to one end of a branch pipe 420. The other end of the branch pipe 420 is connected to the valve 422. The branch pipe 420 communicates with the space 504. The sheet 502 is wound in the form of a spiral as shown in FIG. 1. Each turn spaced from the immediate turns at prescribed intervals by means of a spacer 508.

The degassing member 500 is arranged in the intermediate tank 368, with its upper portion located a little below the upper-limit level H and its the lower end positioned near the bottom of the intermediate tank 368. Hence, the surface area of the member 500 which contacts the developing liquid (hereinafter called "degassing area) much increases when the developing liquid is filled in the tank 368 to the upper-limit level H. It follows that the developing liquid can be degassed very efficiently when it is filled the tank 368 to the upper-limit level H.

Being a flexible sheet wound in the form of a spiral, the degassing member 500 has a large degassing surface and can therefore degass the developing liquid more efficiently than the degassing members 212 of the third embodiment (FIG. 8) which is a spiral tube. Being a spiral, the member 500 provides a space like the degassing member 212, making it easy to arrange the first level sensor 404 in the first intermediate tank 368.

A liquid supplying device according to the fifth embodiment of the present invention will be described. This device is identical to the third embodiment shown in FIG. 8, except that intermediate tanks 368 and 370 contain each three degassing members of the types shown in FIG. 13. Since the tanks 368 and 370 are identical in structure, only the first intermediate tank 368 will be described, with reference to FIG. 13.

Figure 13:
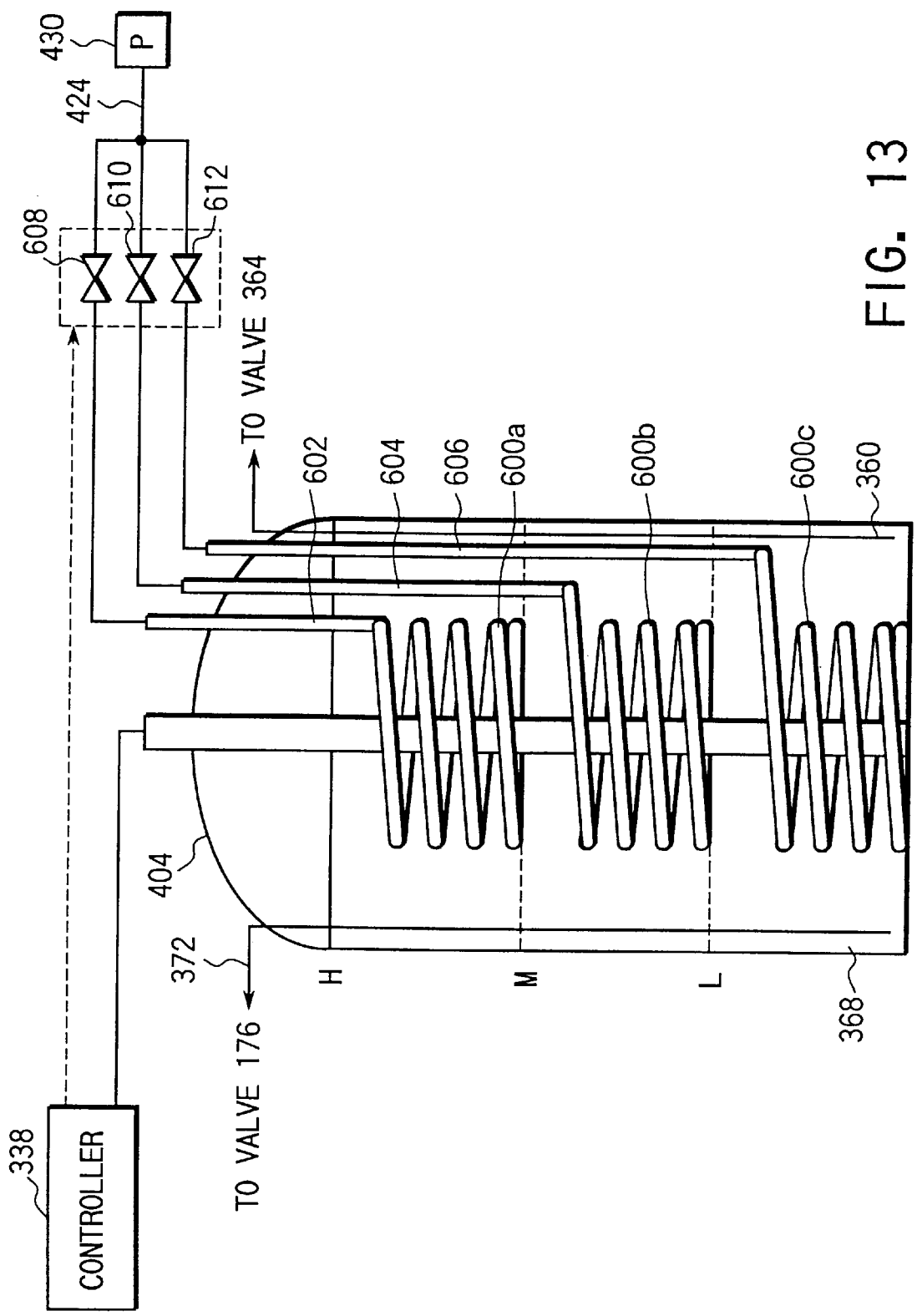
FIG. 13 is a diagram showing one of the degassing members used in a liquid supplying device according to a fifth embodiment of the present invention.

As seen from FIG. 13, an upper-limit surface H, an intermediate-limit surface M and a lower-limit surface L are set for the first intermediate tank 368. Three degassing members 600a, 600b and 600c are provided in the intermediate tank 368. The first degassing member 600a is located between the upper- and intermediate-limit levels H and M. The second degassing member 600b is located between the intermediate- and lower-limit level L. The third degassing member 600c is located between the lower-limit level L and the bottom of the tank 368. Thus, the degassing members 600a, 600b and 600c do not overlap in the vertical direction.

The degassing members 600a, 600b and 600c have the same structure as the degassing member 412 used in the third embodiment (FIG. 8). They provide a space, making it easy to arrange the level sensor 404 in the intermediate tank 368.

Branch pipes 602, 602 and 602 are connected at one end to the degassing members 600a, 600b and 600c and at the other end to one end of an evacuation pipe 424 by valves 608, 610 and 612, respectively. The other end of the evacuation pipe 424 is connected to a vacuum suction unit 430. The valves 608, 610 and 612 are opened and closed, independently of one another. Each valve is automatically controlled by the control signal generated by a controller 338 and representing the surface level of the developing liquid which the level sensor 404 has detected.

To degass the developing liquid filled in the tank 368 to the upper-limit level H, the valves 608, 610 and 612 are opened. All degassing members 600a, 600b and 600c are thereby depressurized by the vacuum suction unit 430. To degass the developing liquid after a prescribed amount of the liquid is supplied from the tank 368 and while no developing liquid is being applied to a wafer W, the valves 608, 610 and 612 are opened and closed in the following manner.

When the level sensor 404 detects that the surface of the liquid is at a level between the upper- and intermediate-limit levels H and M, the controller 338 generates a control signal, which opens the valves 610 and 612, whereas the valve 608 remains closed. Hence, the degassing members 600b and 600c degass the developing liquid, while the degassing member 600a does not degass the liquid. When the level sensor 404 detects that the surface of the liquid is at a level between the intermediate- and lower-limit levels M and L, the controller 338 generates a control signal, which opens the valve 612 only. In this case, only the degassing member 600c degasses the developing liquid. In other words, only the degassing member or members that are completely immersed in the developing liquid degass the liquid. This means that the developing liquid is degassed efficiently.

In the third embodiment shown in FIG. 8, the degassing members 412 and 414 are spiral tubes. In the fourth embodiment illustrated in FIG. 11, the degassing member 500 is a flexible sheet wound in the form of a spiral. Nonetheless, the members 412, 414 and 500 may be re-designed to degass re-designed in accordance with the type of a developing liquid which will be applied to wafers W, so as to degass the developing liquid with high efficiency. The number of turns of each of the degassing members 412, 414 and 500 may be changed in accordance with the amount of liquid which should be removed from the liquid and with the shape of the intermediate tank 368.

In the fifth embodiment shown in FIG. 13, the degassing members 600a, 600b and 600c are substantially identical in shape to the degassing members 412 and 414 incorporated in the third embodiment. Nevertheless, the members 600a, 600b and 600c may be replaced by degassing members similar to the degassing member 500 which is used in the forth embodiment. Furthermore, degassing members having any shape other than described can be used in the present invention. The fifth embodiment may have two degassing members or at least four degassing members, instead of three degassing members 600a, 600b and 600c.

The third to fifth embodiments are designed for supplying a developing liquid to two developers 128' and 129'. Nonetheless, the third to fifth embodiments can be used to supply liquids to various coating apparatuses. Further, the objects to which liquids are applied are not limited to wafers. The objects may be, for example, glass substrates of LCDs.

Moreover, the third to fifth embodiment may have the branch pipes 158 and 170 and valves 160 and 174, all used in the first and second embodiments. In this case, the valves 160 and 174 are exclusively controlled to supply the developing liquid to the nozzle N1 of the first developer 128' and the nozzle N1 of the second developer 129' as in the first and second embodiments.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

We claim:

1. A liquid supply device for supplying a liquid to a plurality of apparatuses which include a first apparatus and a second apparatus, and each of which has at least one liquid-applying member for applying the liquid to an associated one of a plurality of substrates to process the substrates, comprising:
   at least one tank for containing the liquid;
   a supply passage for supplying the liquid from said tank to the apparatuses;
   branch passages communicating with said supply passage, for supplying the liquid to each of the liquid-applying members;
   valves provided on said branch passages, respectively, for opening and closing said branch passages;
   control means for controlling the valves such that when one of the valves is opened, the others are closed, in a case where the liquid-applying member of one apparatus is applying the liquid to the substrate, the liquid-applying members of the other apparatuses cannot apply the liquid, and there is a time period in which the liquid is not applied, between a time at which the liquid-applying member of said first apparatus applies the liquid and a time at which the liquid-applying member of said second apparatus applies the liquid; and
   means for setting an upper-limit level and a lower-limit level of the liquid stored in the tank so that the liquid is replenished to a level between the upper-limit level and the lower-limit level while the liquid-applying members of said apparatuses remain to apply the liquid to the substrates.

2. A liquid supplying device for supplying a liquid to a plurality of apparatuses which include a first apparatus and a second apparatus, and each of which has at least one liquid-applying member for applying the liquid to an associated one of a plurality of substrates to process the substrates, comprising:
   at least one tank for containing the liquid;
   a supply passage for supplying the liquid from said tank to the apparatuses;
   branch passages communicating with said supply passage, for supplying the liquid to each of the liquid-applying members;
   valves provided on said branch passages, respectively, for opening and closing said branch passages such that when the liquid-applying member of one apparatus is applying the liquid to the substrate, the liquid-applying members of the other apparatuses cannot apply the liquid, and there is a time period in which the liquid is not applied, between a time at which the liquid-applying member of said first apparatus applies the liquid and a time at which the liquid-applying member of said second apparatus applies the liquid, the valves being opened and closed such that when one of the valves is opened, the others are closed;
   evacuation means provided outside said tanks;
   a plurality of degassing members provided in said tanks, respectively, for degassing the liquid contained in said tanks while immersed in the liquid, each of said degassing members comprising a body made of a gas-liquid separating material; and an evacuation passage making said body of the degassing member communicate with said evacuation means.

3. A device according to claim 2, wherein said body of the degassing member comprises a tube having a hollow portion, and the liquid supplying device further comprises:
   a space maintaining member, provided in the hollow portion of said tube, for maintaining a shape of the hollow portion of the tube; and
   evacuation means for communicating with the hollow portion of the tube through an evacuation passage, said evacuation means being provided outside the tank.

4. A device according to claim 3, wherein the tube is flexible.

5. A device according to claim 4, wherein each of said tubes is bent in the form of a spiral.

6. A liquid supplying device for supplying a liquid to a plurality of apparatuses which include a first apparatus and a second apparatus, and each of which has at least one liquid-applying member for applying the liquid to an associated one of a plurality of substrates to process the substrates, comprising:
   a plurality of tanks for containing the liquid;
   a supply passage for supplying the liquid from each of said tanks to the apparatuses;
   branch passages communicating with said supply passage, for supplying the liquid to each of the liquid-applying members;
   valves provided on said branch passages, respectively, for opening and closing said branch passages such that when the liquid-applying member of one apparatus is applying the liquid to the substrate, the liquid-applying members of the other apparatuses cannot apply the liquid, and there is a time period in which the liquid is not applied, between a time at which the liquid-applying member of said first apparatus applies the liquid and a time at which the liquid-applying member of said second apparatus applies the liquid, the valves being opened and closed such that when one of the valves is opened, the others are closed;

evacuation means provided outside said tanks;

a plurality of degassing members provided in said tanks, respectively, for degassing the liquid contained in said tanks while immersed in the liquid, each of said degassing members comprising a sheet-shaped body made of a gas-liquid separating material, a space-maintaining member inserted in the body and providing and maintaining a space in the body, and an interval-maintaining member, said body wound, forming turns spaced at intervals by said interval-maintaining member; and an evacuation passage making said space communicate with said evacuation means.

7. A liquid supplying device for supplying a liquid to a plurality of apparatuses which include a first apparatus and a second apparatus, and each of which has at least one liquid-applying member for applying the liquid to an associated one of a plurality of substrates to process the substrates, comprising:

a plurality of tanks for containing the liquid;

a supply passage for supplying the liquid from each of said tanks to the apparatuses;

branch passages communicating with said supply passage, for supplying the liquid to each of the liquid-applying members;

valves provided on said branch passages, respectively, for opening and closing said branch passages such that when the liquid-applying member of one apparatus is applying the liquid to the substrate, the liquid-applying members of the other apparatuses cannot apply the liquid, and there is a time period in which the liquid is not applied, between a time at which the liquid-applying member of said first apparatus applies the liquid and a time at which the liquid-applying member of said second apparatus applies the liquid, the valves being opened and closed such that when one of the valves is opened, the others are closed;

evacuation means provided outside said tanks;

a plurality of degassing members provided in each of said tanks and positioned such that tops of the degassing members are at different levels, for degassing the liquid contained in said tank while immersed in the liquid, each of said degassing members comprising a body made of a gas-liquid separating material and providing and maintaining a space in the body; and an evacuation passage making the spaces of the degassing members communicate with said evacuation means.

8. A device according to claim 7, further comprising a plurality of level sensors provided in said tanks, respectively, for detecting surfaces of the liquid contained in said tanks, and a controller for opening and closing said evacuation passage.

9. A liquid supplying device for supplying a liquid to a plurality of apparatuses which include a first apparatus and a second apparatus, and each of which has at least one liquid-applying member for applying the liquid to an associated one of a plurality of substrates to process the substrates, comprising:

a plurality of tanks for containing the liquid;

a supply passage for supplying the liquid from said tank to the apparatuses;

a switching device for achieving switching from one of said tanks to any other one of said tanks;

branch passages communicating with said supply passage, for supplying the liquid to each of the liquid-applying members;

valves provided on said branch passages, respectively, for opening and closing said branch passages such that when the liquid-applying member of one apparatus is applying the liquid to the substrate, the liquid-applying members of the other apparatuses cannot apply the liquid, and there is a time period in which the liquid is not applied, between a time at which the liquid-applying member of said first apparatus applies the liquid and a time at which the liquid-applying member of said second apparatus applies the liquid, the valves being opened and closed such that when one of the valves is opened, the others are closed;

evacuation means provided outside said tanks;

a plurality of degassing members provided in said tanks, respectively, for degassing the liquid contained in said tanks while immersed in the liquid, each of said degassing members comprising a body made of a gas-liquid separating material; and an evacuation passage making said body of the degassing member communicate with said evacuation means.

10. A device according to claim 9, wherein said body of the degassing member comprises a tube having a hollow portion, and the liquid supplying device further comprises:

a space maintaining member, provided in the hollow portion of said tube, for maintaining a shape of the hollow portion of the tube; and evacuation means communicating with the hollow portion of the tube through an evacuation passage, said evacuation means being provided outside the tank.

11. A device according to claim 10, wherein the tube is flexible.

12. A device according to claim 11, wherein each of said tubes is bent in the form of a spiral.

13. A liquid supplying device for supplying a liquid to a plurality of apparatuses which include a first apparatus and a second apparatus, and each of which has at least one liquid-applying member for applying the liquid to an associated one of a plurality of substrates to process the substrates, comprising:

a plurality of tanks for containing the liquid;

a supply passage for supplying the liquid from said tanks to the apparatuses;

a switching device for achieving switching from one of said tanks to any other one of said tanks;

branch passages communicating with said supply passage, for supplying the liquid to each of the liquid-applying members;

valves provided on said branch passages, respectively, for opening and closing said branch passages such that when the liquid-applying member of one apparatus is applying the liquid to the substrate, the liquid-applying members of the other apparatuses cannot apply the liquid, and there is a time period in which the liquid is not applied, between a time at which the liquid-applying member of said first apparatus applies the liquid and a time at which the liquid-applying member of said second apparatus applies the liquid, the valves being opened and closed such that when one of the valves is opened, the others are closed;

evacuation means provided outside said tanks;

a plurality of degassing members provided in said tanks, respectively, for degassing the liquid contained in said tanks while immersed in the liquid, each of said degassing members comprising a sheet-shaped body made of gas-liquid separating materials, a space-maintaining member inserted in the body and providing and maintaining a space in the body, and an interval-maintaining member, said body being wound and forming turns spaced at intervals by said interval-maintaining member; and an evacuation passage making said space communicate with said evacuation means.

14. A liquid supplying device for supplying a liquid to a plurality of apparatuses which include a first apparatus and a second apparatus, and each of which has at least one liquid-applying member for applying the liquid to an associated one of a plurality of substrates to process the substrates, characterized by comprising:

a plurality of tanks for containing the liquid;

a supply passage for supplying the liquid from said tanks to the apparatuses;

a switching device for achieving switching from one of said tanks to any other one of said tanks;

branch passages communicating with said supply passage, for supplying the liquid to each of the liquid-applying members;

valves provided on said branch passages, respectively, for opening and closing said branch passages such that when the liquid-applying member of one apparatus is applying the liquid to the substrate, the liquid-applying members of the other apparatuses cannot apply the liquid, and there is a time period in which the liquid is not applied, between a time at which the liquid-applying member of said first apparatus applies the liquid and a time at which the liquid-applying member of said second apparatus applies the liquid, the valves being opened and closed such that when one of the valves is opened, the others are closed;

evacuation means provided outside said tanks;

a plurality of degassing members provided in each of said tanks and positioned such that tops of the degassing members are at different levels, for degassing the liquid contained in said tank while immersed in the liquid, each of said degassing members comprising a body made of a gas-liquid separating material and a space-maintaining member inserted in the body and providing and maintaining a space in the body; and an evacuation passage making the spaces of said degassing members communicate with said evacuation means.

15. A device according to claim 14, further comprising a plurality of level sensors provided in said tanks, respectively, for detecting surfaces of the liquid contained in said tanks, and a controller for opening and closing said evacuation passage.

* * * * *